(12) United States Patent
Kilger et al.

(10) Patent No.: US 7,847,387 B2
(45) Date of Patent: Dec. 7, 2010

(54) ELECTRICAL DEVICE AND METHOD

(75) Inventors: Thomas Kilger, Regenstauf (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 326 days.

(21) Appl. No.: 11/941,625

(22) Filed: Nov. 16, 2007

(65) Prior Publication Data

US 2009/0127638 A1    May 21, 2009

(51) Int. Cl.
*H01L 23/02* (2006.01)
(52) U.S. Cl. .................. 257/686; 257/414; 257/687; 257/698; 257/724; 257/725; 257/E23.128; 257/E23.011; 257/E23.067; 257/E23.125; 257/E23.169; 438/109
(58) Field of Classification Search .............. 257/686, 257/414, 687, 698, 724, 725, E23.128, E23.011, 257/E23.067, E23.125, E23.169; 438/109
See application file for complete search history.

(56) References Cited

U.S. PATENT DOCUMENTS

| | | | |
|---|---|---|---|
| 6,351,390 | B1 | 2/2002 | Mayer et al. |
| 2002/0149298 | A1* | 10/2002 | Furukawa et al. ........... 310/340 |
| 2004/0166335 | A1 | 8/2004 | O'Regan et al. |
| 2004/0209387 | A1 | 10/2004 | Hong |
| 2005/0001331 | A1* | 1/2005 | Kojima et al. ............... 257/778 |
| 2005/0012188 | A1* | 1/2005 | Val ............................ 257/678 |
| 2006/0205119 | A1 | 9/2006 | Appelt et al. |
| 2008/0015421 | A1* | 1/2008 | Penner ....................... 600/300 |
| 2008/0156095 | A1* | 7/2008 | Tsuji et al. ............... 73/504.02 |

\* cited by examiner

*Primary Examiner*—Tu-Tu V Ho
(74) *Attorney, Agent, or Firm*—Dicke, Billig & Czaja, PLLC

(57) ABSTRACT

An electrical device and method is disclosed. One embodiment provides a substrate, a sensor chip disposed completely above a plane section of a surface of the substrate. A structurally homogeneous material layer is disposed above the substrate and the sensor chip. A cavity is formed between the substrate and the material layer. The sensor chip is disposed inside the cavity.

10 Claims, 14 Drawing Sheets

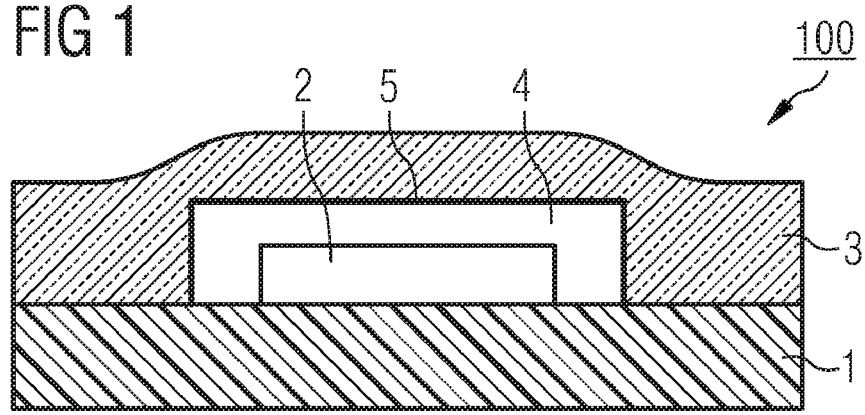
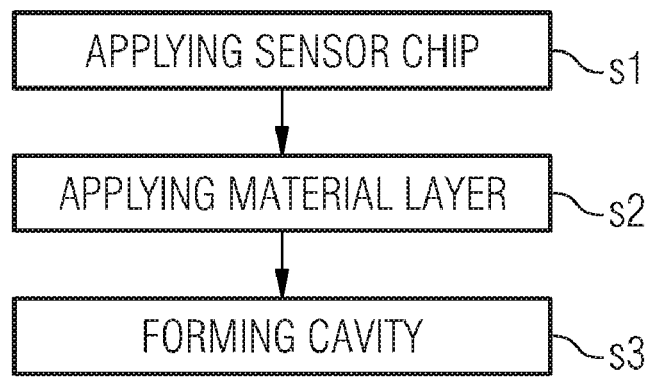
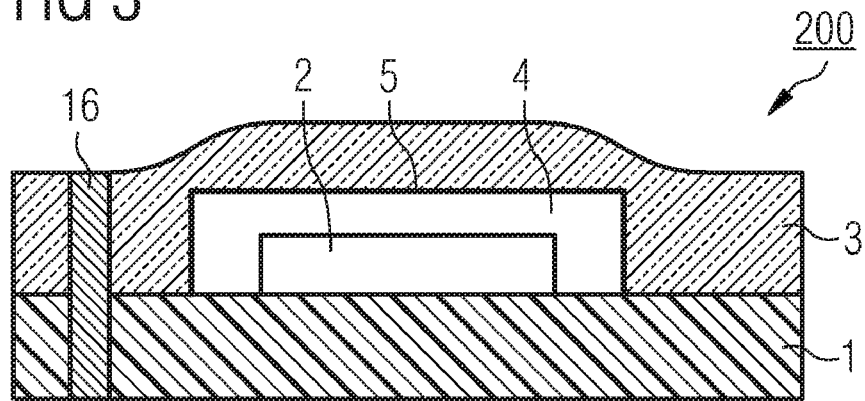

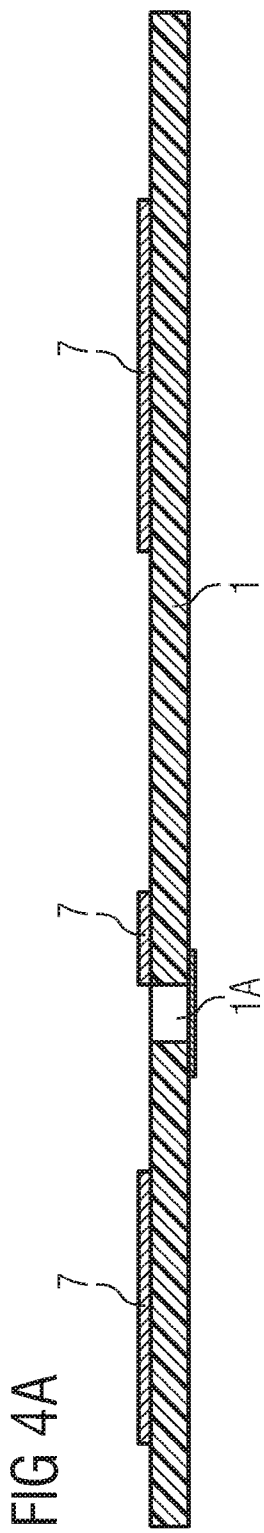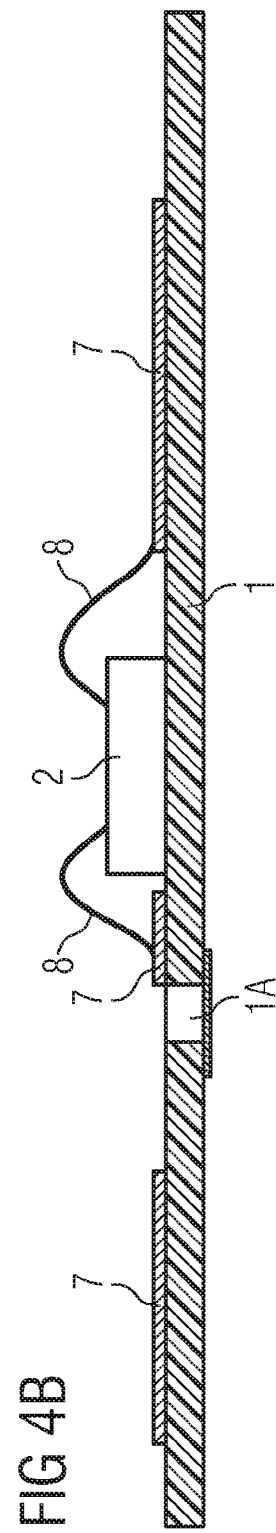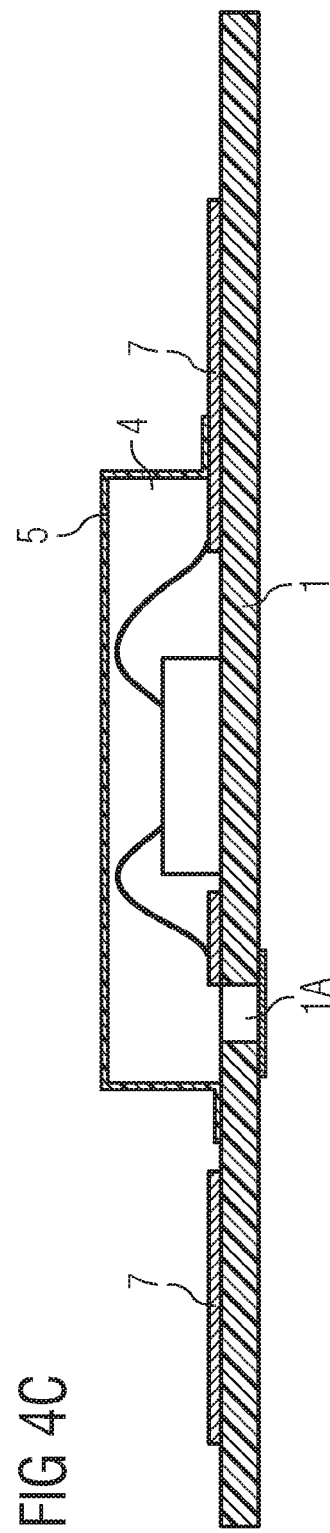

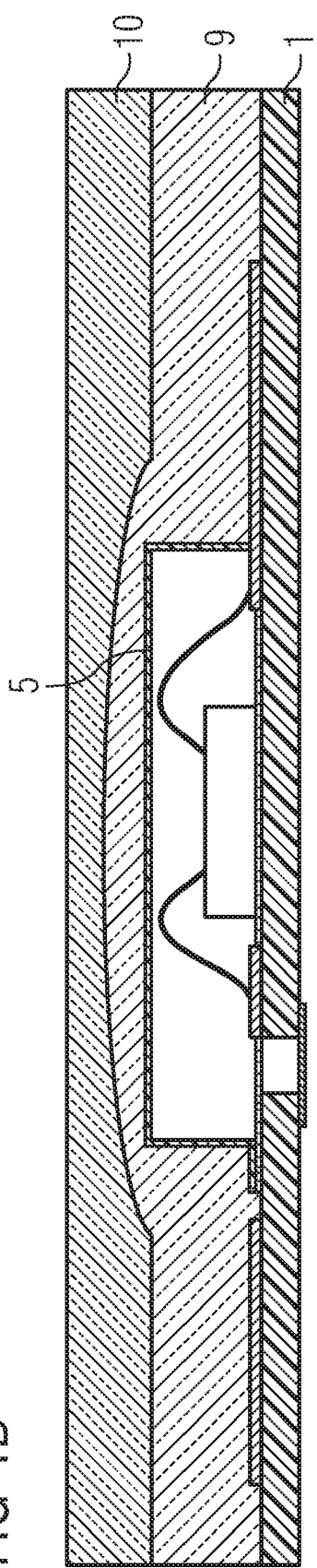
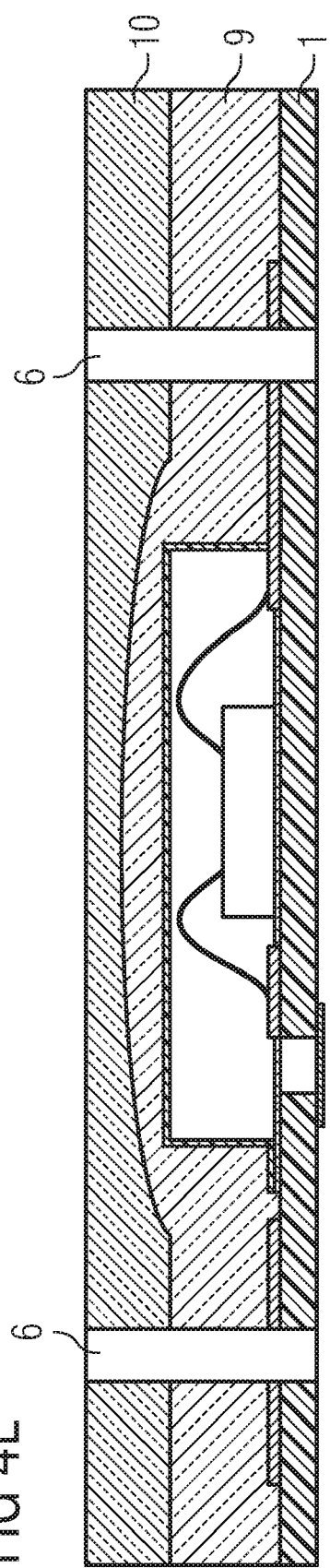

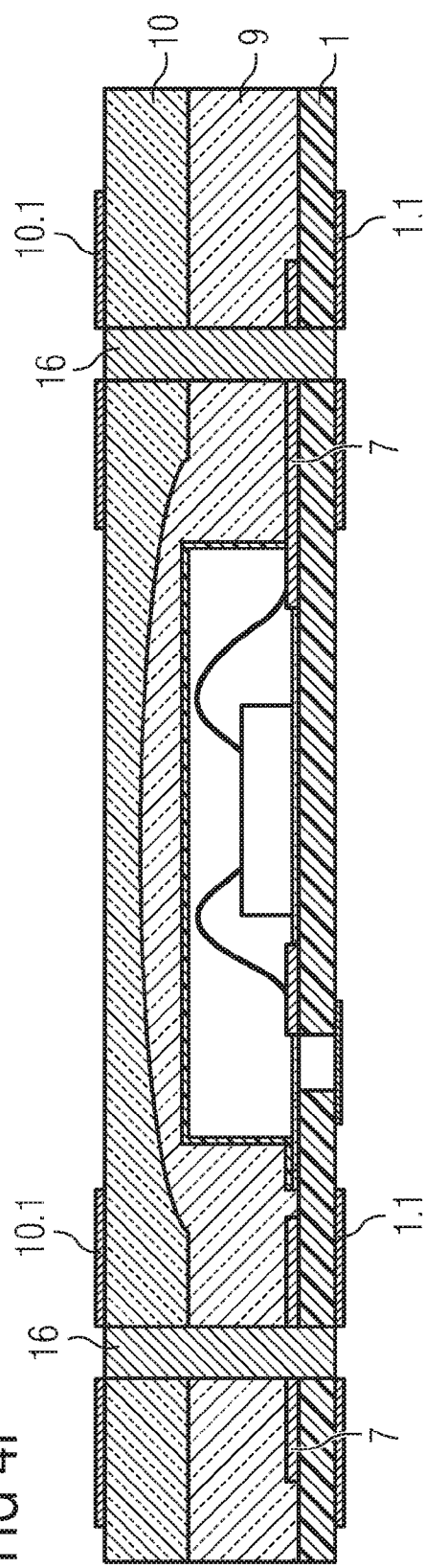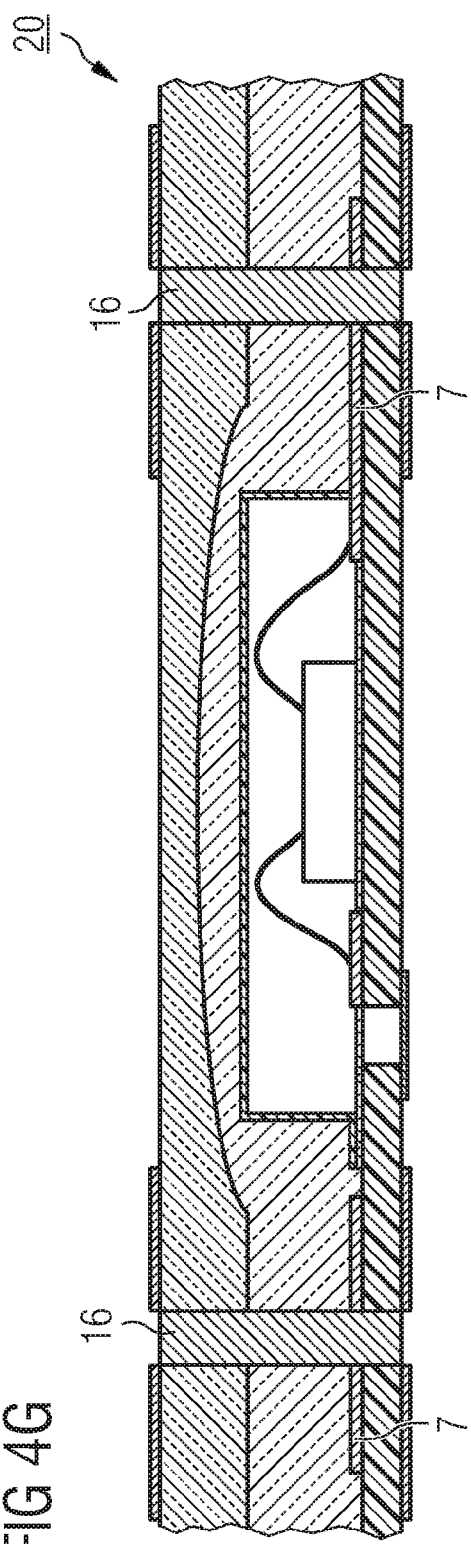

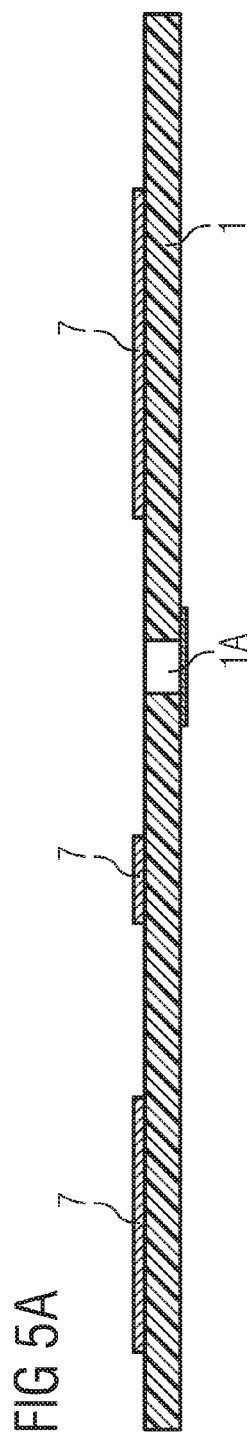
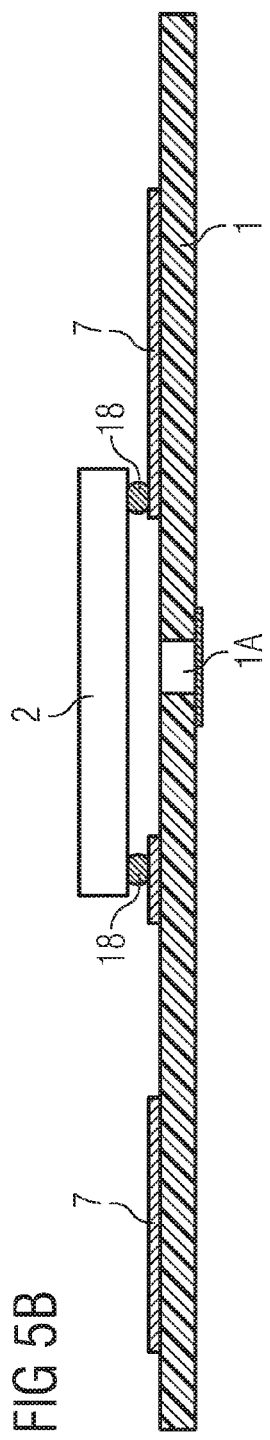
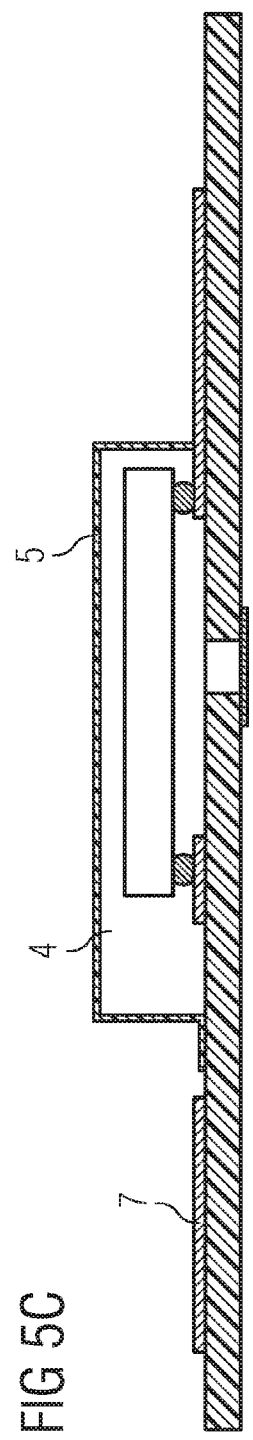

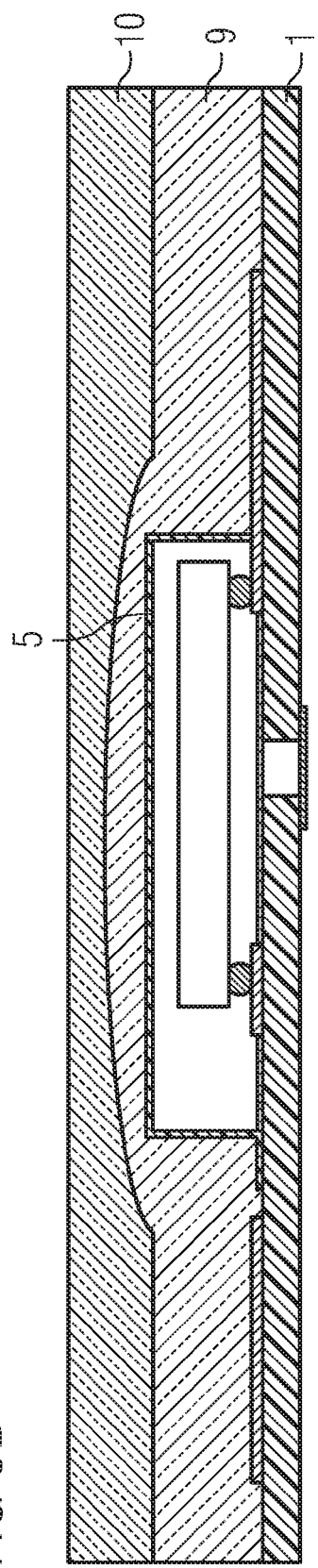
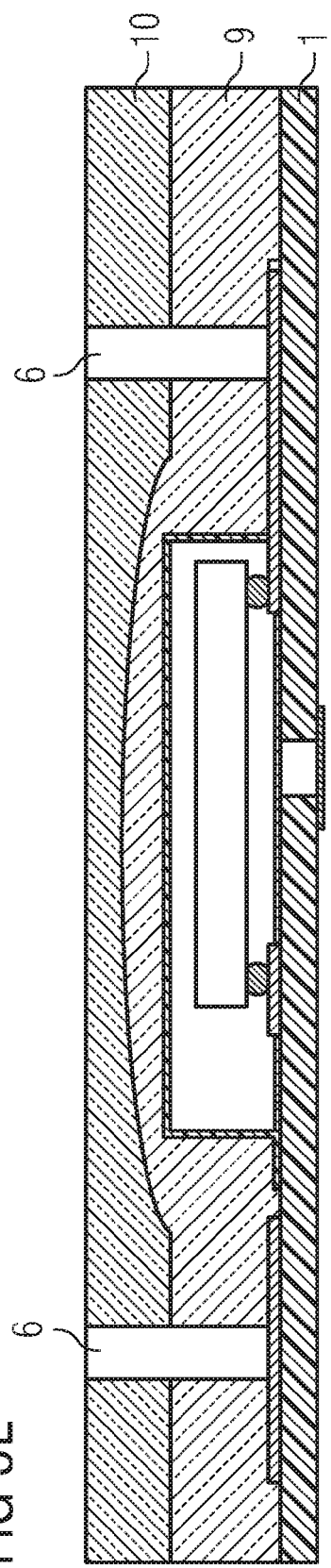

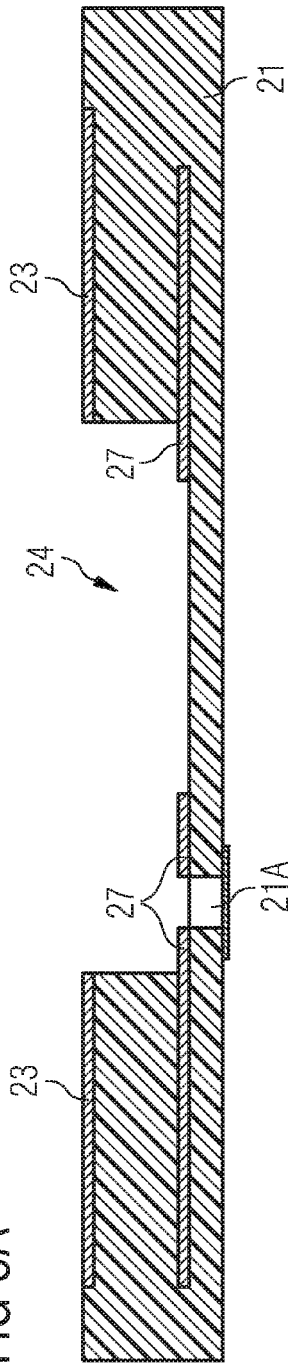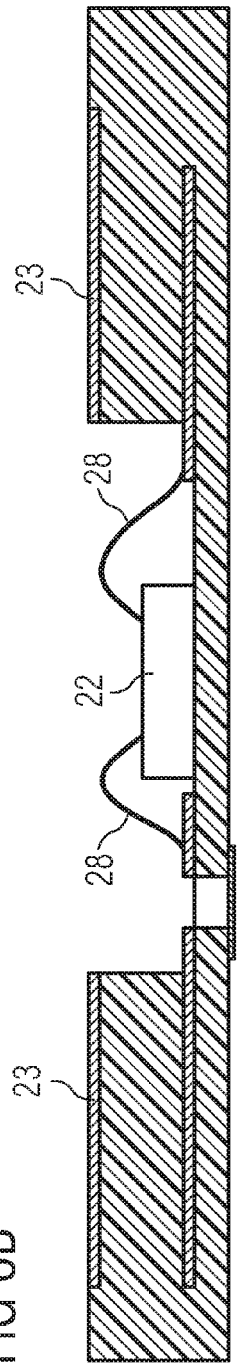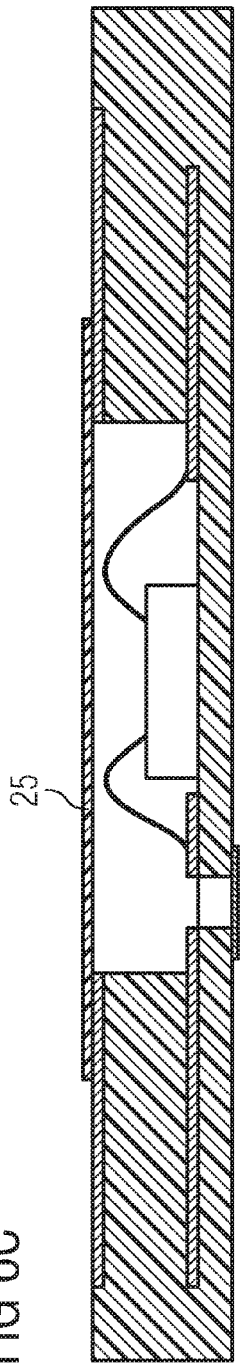

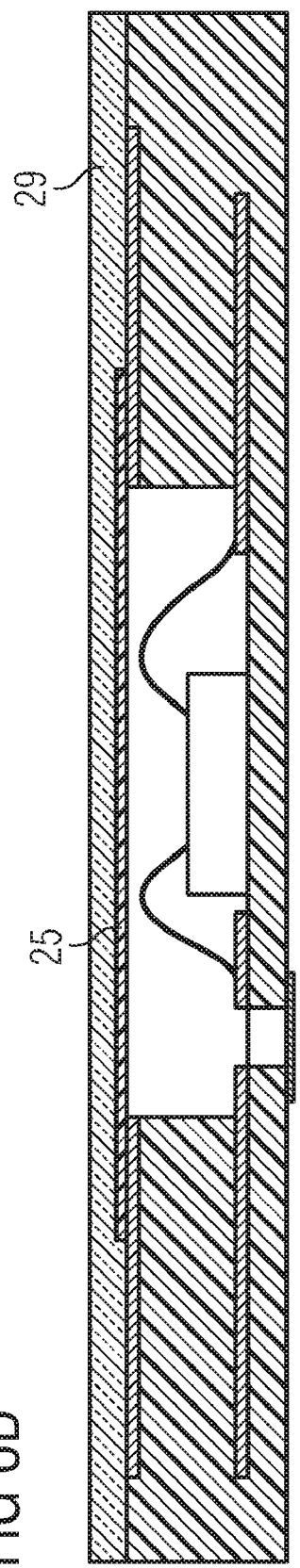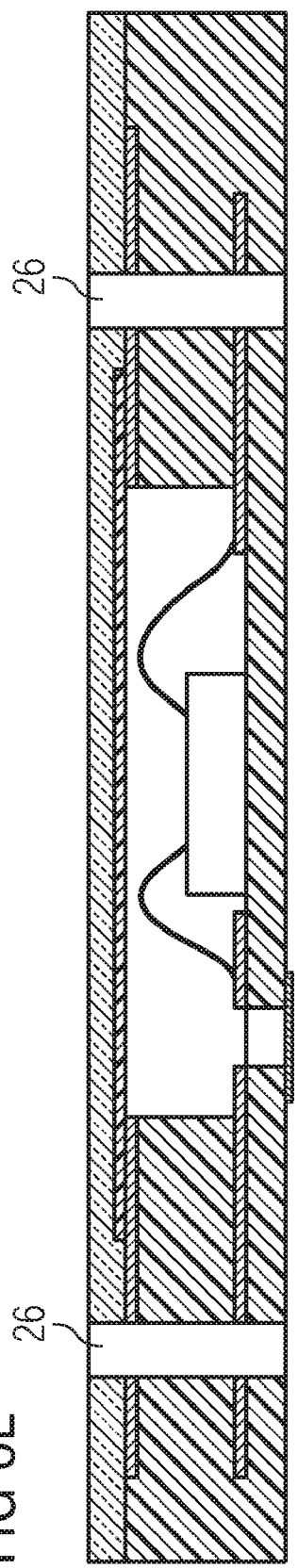

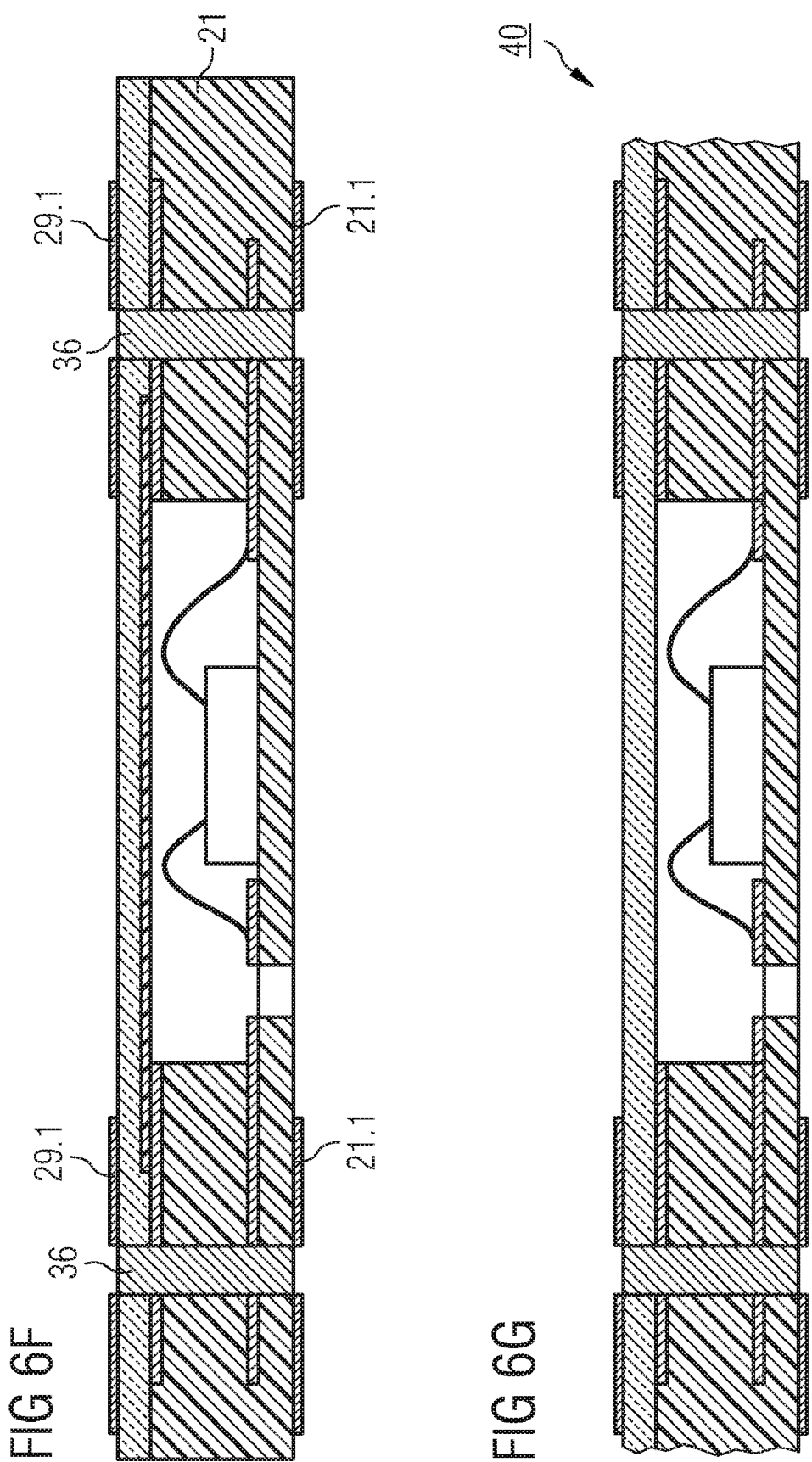

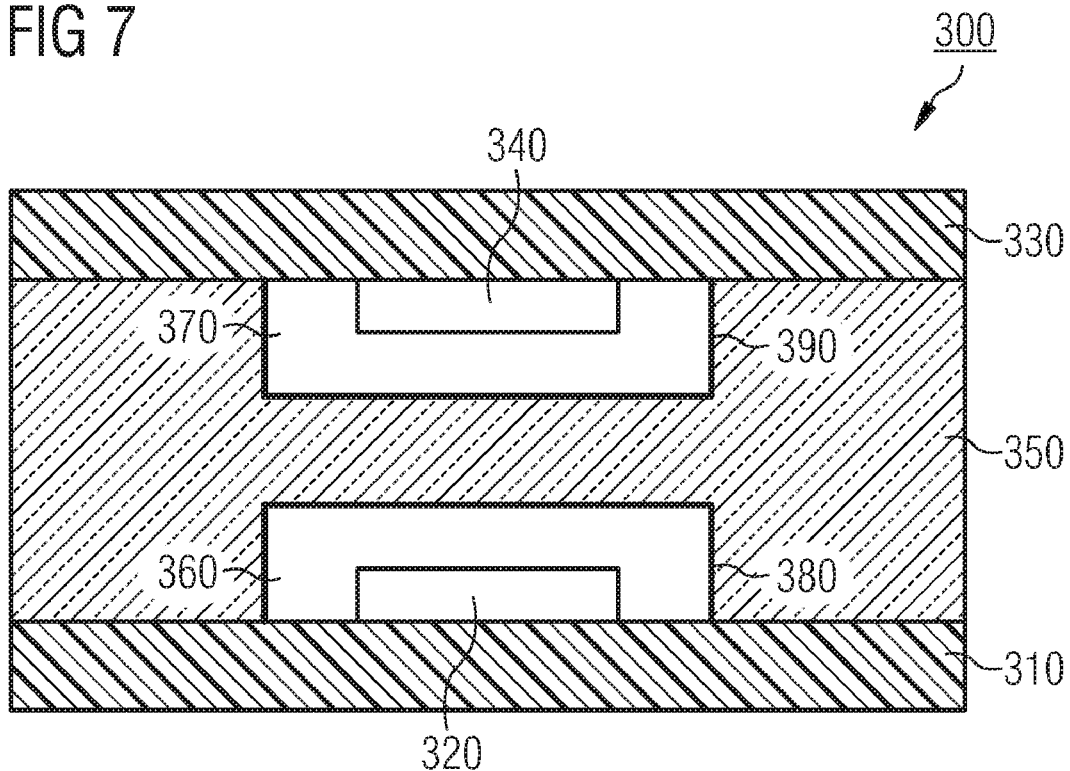
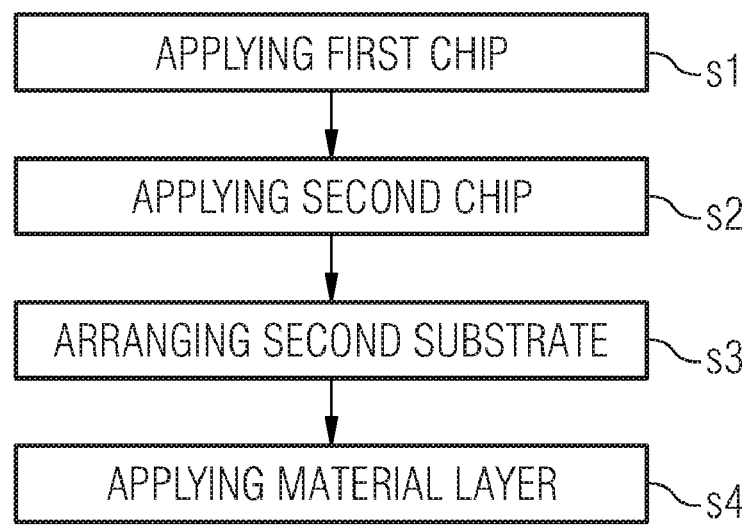

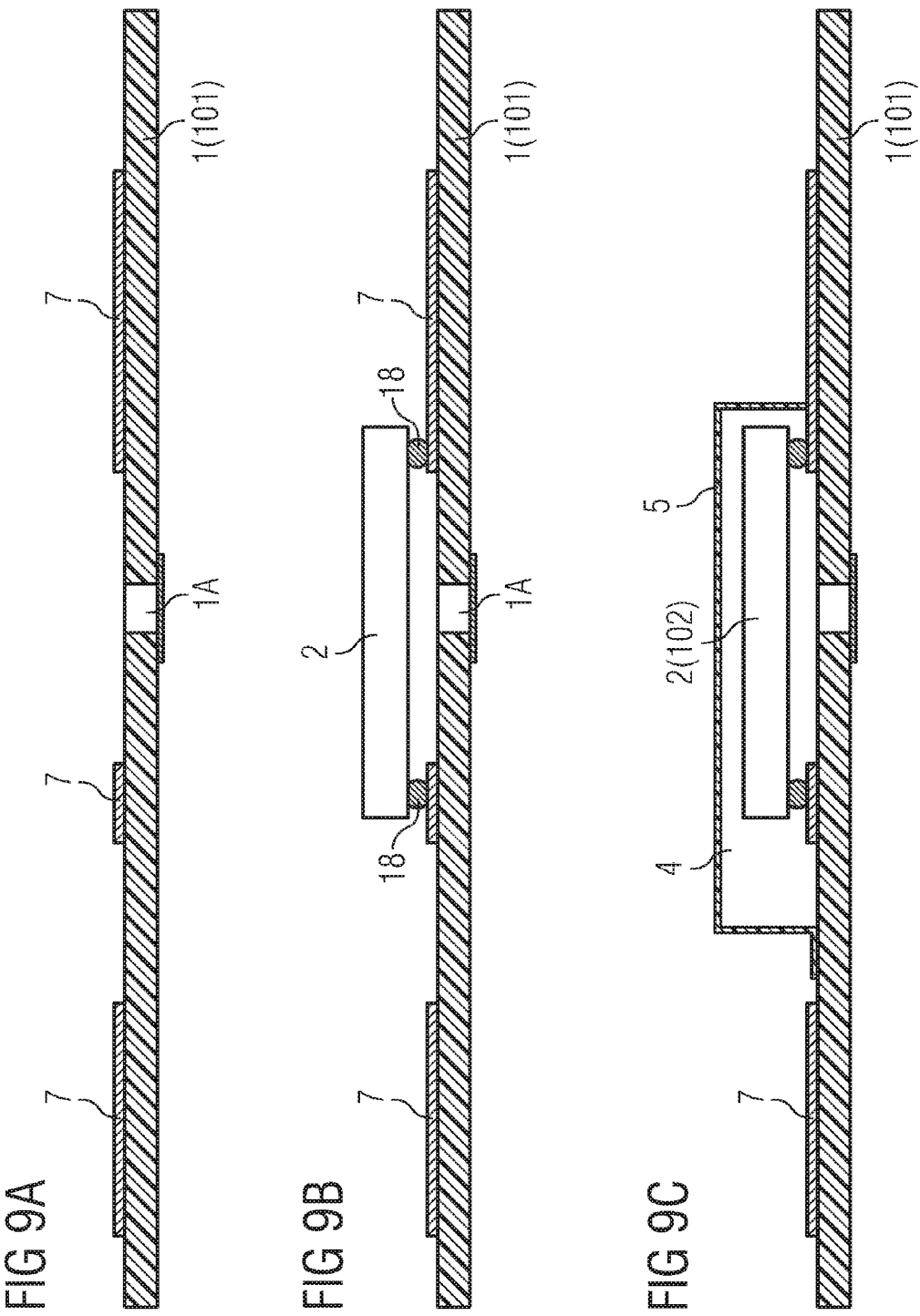

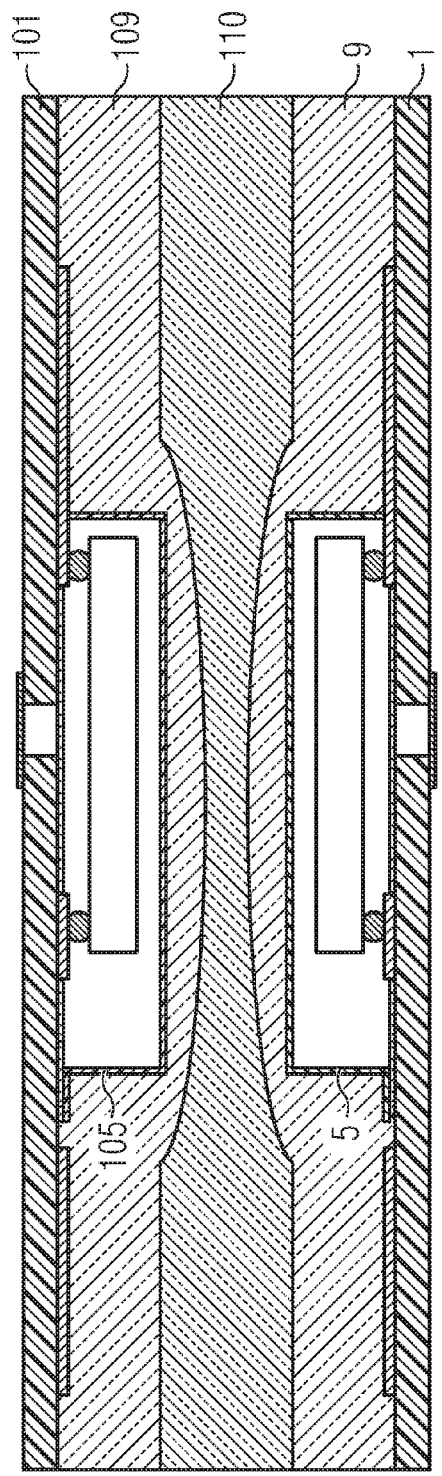
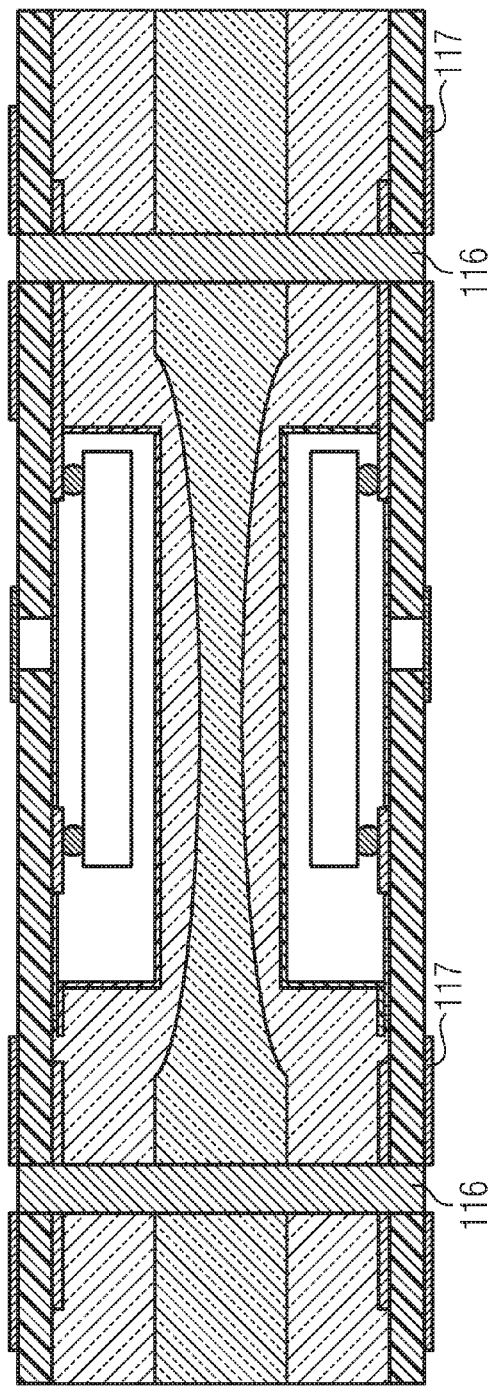
FIG 9D
FIG 9E

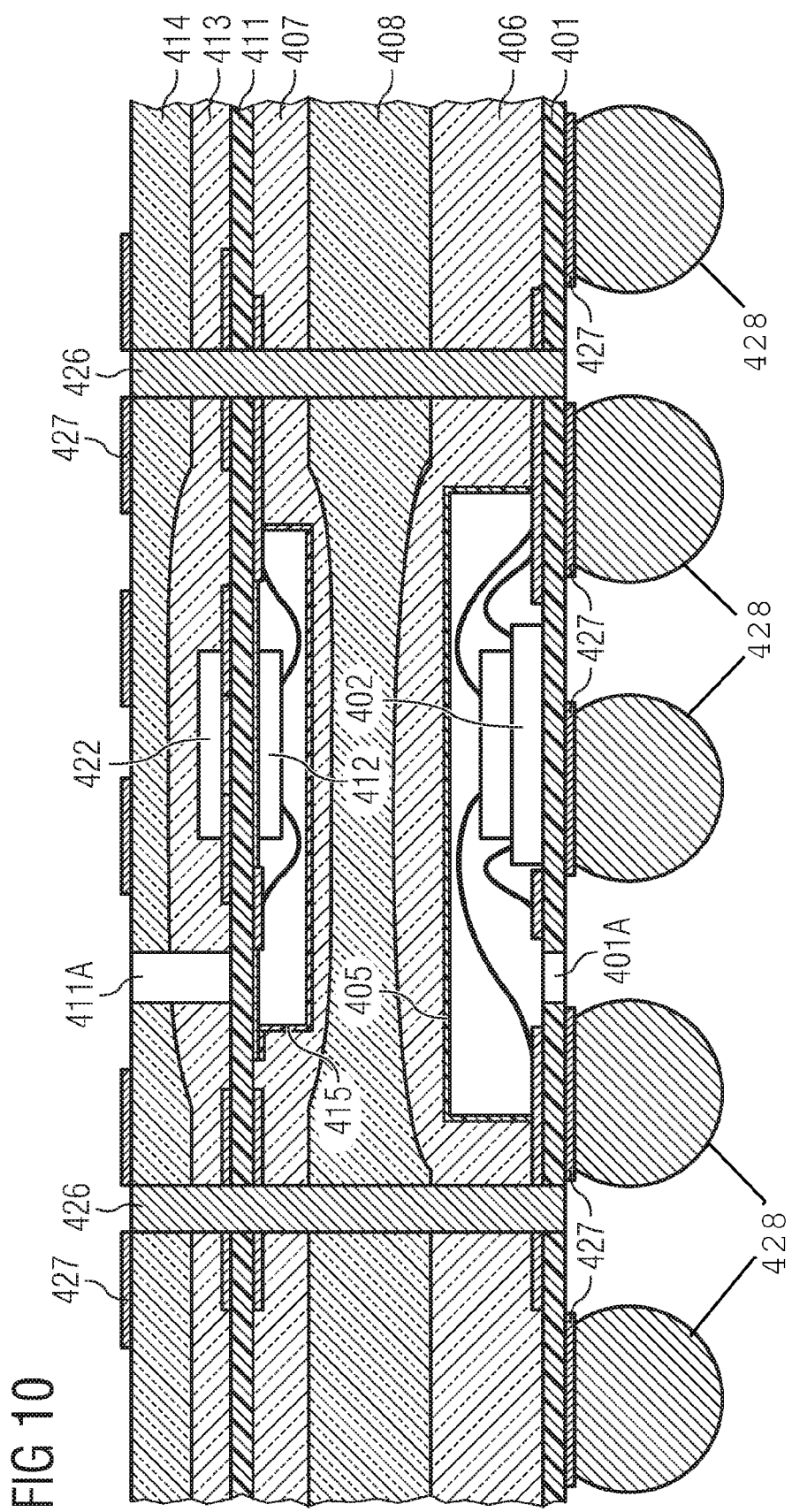

ELECTRICAL DEVICE AND METHOD

BACKGROUND

This invention relates to a device and to a method. More particularly, the invention relates to a device including a sensor chip and a method for fabricating a device including a sensor chip.

Devices including sensor chips are used in every day life. Applications of sensor chips include automobiles, machines, aerospace, medicine, industry and robotics. Technological progress allows more and more sensors to be manufactured on the microscopic scale, mostly included in semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a schematic representation of an embodiment of a device in a sectional side view.

FIG. 2 illustrates a flow diagram of an embodiment of a method for fabricating a device.

FIG. 3 illustrates a schematic representation of an embodiment of a further device in a sectional side view.

FIGS. 4A-G illustrate schematic representations of intermediate products and a device in a sectional side view, respectively, to illustrate fabrication processes to fabricate a device.

FIGS. 5A-G illustrate schematic representations of intermediate products and a further device in a sectional side view, respectively, to illustrate fabrication processes to fabricate the further device.

FIGS. 6A-G illustrate schematic representations of intermediate products and a further device in a sectional side view, respectively, to illustrate fabrication processes to fabricate the further device.

FIG. 7 illustrates a schematic representation of an embodiment of a further device in a sectional side view.

FIG. 8 illustrates a flow diagram of an embodiment of a method for fabricating the further device.

FIGS. 9A-E illustrate schematic representations of intermediate products and a further device in a sectional side view, respectively, to illustrate fabrication processes to fabricate the further device.

FIG. 10 illustrates a schematic representation of an embodiment of a further device in a sectional side view.

DETAILED DESCRIPTION

Figure 5F:
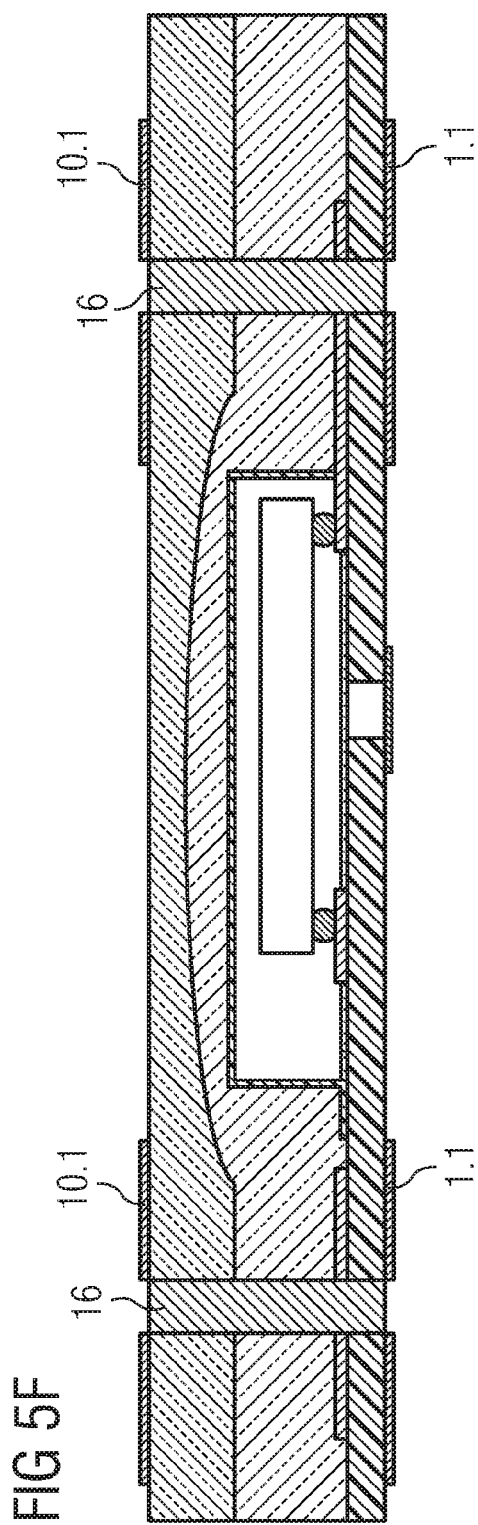

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The devices described in the following contain sensor chips. The specific embodiment of these sensor chips is not important in this case. The sensor chips may contain electro-mechanical or electro-optical functional elements. An example of an electro-mechanical sensor is a microphone. Examples for the electro-optical case are photo-diodes or diode lasers. The sensor chips may also function fully electrically, for example as Hall effect sensors. The sensor chips may be embodied as MEMS (Micro-Electro Mechanical Systems), wherein micro-mechanical moveable structures such as, for example, bridges, membranes or reed structures may be provided. Such sensor chips may be motion sensors, which may be embodied as acceleration sensors (detecting accelerations in different spatial directions) or rotation sensors. Sensors of this type are also referred to as gyrosensors, roll-over sensors, impact sensors, inertial sensors, etc. They are used for example in the automotive industry for signal detection in ESP (Electronic Stability Program) systems, ABS (Anti-Lock Breaking Systems), airbags and the like. Usually such sensor chips are made of a semiconductor material. However, the sensor chips are not limited to be fabricated from a specific semiconductor material. They may additionally contain non-conductive inorganic and/or organic materials.

There are also illustrated devices which may further include a semiconductor chip, which may serve to control the functionality of the sensor chip or to process signals that are sensed and/or generated by the sensor chip. By way of example, in the case of the sensor chip being a motion sensor, the deflection of a moveable element comprised in the sensor chip may be read piezoresistively or capacitively and may then be processed by the semiconductor chip. The semiconductor chip may be coupled to the sensor chip for the purpose of a (bidirectional) data exchange. The semiconductor chip may, for example, be embodied as an ASIC (Application Specific Integrated Circuit).

The substrate supporting the sensor chip may have a thermal expansion coefficient similar or close to the thermal expansion coefficient of the sensor chip, in one embodiment when the substrate is in close contact with the sensor chip. The substrate may thus be fabricated from a material having a thermal expansion coefficient in the range from $0.3 \cdot 10^{-6}/K$ to $8.2 \cdot 10^{-6}/K$ and in the range $4.0 \cdot 10^{-6}/K$ to $4.5 \cdot 10^{-6}/K$.

Devices described herein further contain a material layer. Such material layer may contain a mold compound, for example, be made of a thermoplastic resin or a thermosetting plastic (e.g., epoxy resin). In one embodiment, the material layer may be comprised of a prepreg material, for example, a prepreg material comprised of an epoxy material filled with glass fibers or, in other words, a glass fiber arrangement filled with or impregnated with an epoxy material.

Referring to FIG. 1, there is illustrated a schematic representation of an embodiment of a device in a sectional side view. The device 100 as depicted includes a substrate 1 which can, for example, be made of a standard material for printed circuit boards. A sensor chip 2 is arranged above the substrate 1. Different embodiments of arranging the sensor chip 2 above the substrate 1 are illustrated further below. The sensor chip 2 can be, for example, a MEMS chip. Further-on, a structurally homogenous material layer 3 is disposed above the substrate 1 and the sensor chip 2 so that a cavity 4 is formed between the substrate 1 and the material layer 3, wherein the sensor chip 2 is disposed inside the cavity 4.

The material layer 3 can include or consist of a prepreg (pre-impregnated fibers) which has been laminated onto the substrate 1. The material layer 3 can thus include an epoxy material filled with glass fibers or a glass fiber arrangement as, for example, a glass fiber mat, soaked or impregnated with epoxy material. The material layer 3 can further be laminated in such a way that it is essentially or ideally planarized at its upper surface.

The material layer 3 is arranged above the substrate 1 and the sensor chip 2 in such a way that a cavity 4 is formed between the substrate and the material layer 3. For this purpose a housing 5 can be arranged on the substrate 1 so that the walls of the housing 5 form the boundaries of the cavity 4. The housing 5 can be made of any adequate solid state material like, for example, a metallic material, a plastic material, or a semiconductor material. A housing 5 made of an electrically conducting material would serve for electrically and magnetically shielding the sensor chip 2. The material layer 3 can be laminated onto the housing 5.

Referring to FIG. 2, there is illustrated a flow diagram of an embodiment of a method for fabricating a device. The method includes applying a sensor chip completely above a plane section of a surface of a substrate (s1), applying a structurally homogeneous material layer above the substrate and the sensor chip (s2), and forming a cavity between the substrate and the material layer with the sensor chip disposed inside the cavity (s3).

In one embodiment, a housing is arranged above the substrate so that the cavity is defined by the inner walls of the housing.

According to a further embodiment, the material of the material layer includes or consists of a prepreg material, the material layer is laminated onto the substrate and/or the housing, in one embodiment during the application of pressure and/or heat to the whole arrangement.

According to a further embodiment, at least one through-hole is formed through the substrate and the material layer. The through-hole can be filled with an electrically conductive material so that the through-hole can be used for electrically connecting contact elements.

According to a further embodiment, two or more of at least one sensor chip and at least one semiconductor chip can be applied above the substrate, and then after applying the material layer and further processes, a singulating procedure will be conducted in order to produce a plurality of devices.

Referring to FIG. 3, there is illustrated a schematic representation of an embodiment of a device in a sectional side view. The device 200 as depicted includes a substrate 1 which can, for example, be made of a standard material for printed circuit boards. A sensor chip 2 is arranged above the substrate 1. Different embodiments of arranging the sensor chip 2 above the substrate 1 are illustrated further below. The sensor chip 2 can be, for example, a MEMS chip. Further-on, a material layer 3 is disposed above the substrate 1 and the sensor chip 2 so that a cavity 4 is formed between the substrate 1 and the material layer 3, wherein the sensor chip 2 is disposed inside the cavity 4.

The material layer 3 can include or consist of a prepreg (pre-impregnated fibers) which has been laminated onto the substrate 1. The material layer 3 can thus include an epoxy material filled with glass fibers or a glass fiber arrangement as, for example, a glass fiber mat, soaked or impregnated with epoxy material. The material layer 3 can further be laminated in such a way that it is essentially or ideally planarized at its upper surface.

The material layer 3 is arranged above the substrate 1 and the sensor chip 2 in such a way that a cavity 4 is formed between the substrate and the material layer 3. For this purpose a housing 5 can be arranged on the substrate 1 so that the walls of the housing 5 form the boundaries of the cavity 4. The housing 5 can be made of any adequate solid state material like, for example, a metallic material, a plastic material, or a semiconductor material. A housing 5 made of an electrically conducting material would serve for electrically and magnetically shielding the sensor chip 2. The material layer 3 can be laminated onto the housing 5.

The device 200 further includes an electrical conductor 16 formed through the substrate 1 and the material layer 3. The electrical conductor 16 thus extends from an upper surface of the material layer 3 down to a lower surface of the substrate 1. The electrical conductor 16 can be produced by forming a through-hole and filling it with an electrically conductive material and it can be used to electrically connect electrical contact elements arranged on the surface of the substrate 1 and on the surface of the material layer 3, respectively.

The devices described so far and methods for fabricating them offer the following advantages and will also become more evident from further detailed embodiments described herein below. Electrical contacts can be arranged on both sides of the fabricated devices in a merely arbitrary manner so that a maximum of freedom of design can be reached. Furthermore, an upside-down placement of the chips by, for example, the flip-chip technique, is easily possible so that the signal access through-hole can be provided in the substrate directly below the chip. Furthermore, the concept of the device and its fabrication is very flexible as, for example, as well two or more cavities can be integrated and connected with arbitrary components like further chips or electrical devices. The cavities can, for example, be formed in one or more different material layers. Furthermore, the fabrication can be efficiently conducted in large wafer scale panels in which a plurality of devices can be fabricated in parallel and at the end the panel can be singulated into a respective plurality of sensor chip packages.

Referring to FIGS. 4A-G, there are illustrated schematic representations of intermediate products and a device in a sectional side view, respectively, for illustrating fabrication processes for fabricating a device.

Referring to FIG. 4A, a substrate 1 is provided which can be made of any standard substrate material like, for example, any material conventionally used for printed circuit boards. In one embodiment, the substrate material can also be any other material like, for example, ceramic, glass, plastic, or the substrate 1 can also be made of a lead frame and thus consists of a metallic material. On the upper surface of the substrate 1 contact elements 7 like, for example, contact pads are provided. The contact pads 7 can be made of any electrically conductive material and they can, for example, be printed onto the upper surface of the substrate 1. In the substrate 1 there is formed a through-hole 1A to serve for signal access to the sensor chip. However, this is only required according to the functionality of the sensor chip. Instead of one through-hole 1A also a plurality of respective through-holes can be provided. FIG. 4A only illustrates one section of the substrate 1 and the further elements. A plurality of similar sections are disposed laterally side-by-side for receiving a respective plurality of sensor chips 2. At the end the whole panel will be singulated into single sensor chip packages.

Referring to FIG. 4B, a sensor chip 2 is applied to the upper surface of the substrate 1 by, for example, attaching a lower, non-active surface of the sensor chip 2 to the upper surface of the substrate 1 by using an adhesive layer or solder paste or any other conductive or non-conductive material. On the upper surface of the sensor chip 2, there are provided electrical contact pads (not illustrated) of the sensor chip 2 which are connected by bond wires 8 to selected ones of the electrical contact elements 7, respectively. The substrate 1 can, for example, have the form and size of a conventional semiconductor wafer, i.e. a circular shape having a diameter of several inches. In one embodiment, the substrate 1 can also have a square shape. In any way, according to the present embodiment a plurality of sensor chips 2 are attached onto the substrate 1 in a sufficient distance from each other. The figures only illustrate the fabrication in one segment of the substrate 1. It should be noted that similar or equal fabrication processes will be carried out in all other segments of the substrate 1 and in a final process the whole arrangement will have to be separated into single sensor chip packages.

According to FIG. 4C, a housing 5 is applied to the upper surface of the substrate 1. The housing 5 can be attached to the upper surface of the substrate 1 by using an adhesive material which can be conductive or non-conductive. The material of the housing 5 can be any appropriate solid-state material like, for example, a metal, a plastic, or a semiconductor material. An electrically conductive material for the housing 5 attached to the upper surface of the substrate 1 by use of an electrically conductive adhesive material would also function as an electrical and/or magnetical shielding element. The housing 5 can have a horizontal cover plate and four vertical side cover plates so that it surrounds the sensor chip 2 virtually at all sides and thus hermetically seals the sensor chip 2. At least some of the contact elements 7 may extend under a wall of the housing 5 from the inside of the cavity 4 to the outside of the cavity 4. The walls of the housing 5 can have a thickness which is, for example, below 1 mm, or even below 0.5 mm, or even below 300, 200 or 100 μm.

Referring to FIG. 4D, a first material layer 9 has been applied onto the housing 5 and the substrate 1. The first material layer 9 may consist of or include a prepreg material in a state in which it is not yet hardened so that it has a certain fusibility. This fusibility can be utilized to form the first material layer 9 during the application of pressure and/or heat to the whole arrangement. Due to the flowing processes during the pressure-influenced hardening of the prepreg material layer 9 it will assume an ideally or virtually flat upper surface. The process of applying the first material layer 9 onto the substrate 1 and the housing 5 can be essentially a laminating process. After applying of the first material layer 9 a second material layer 10 can be applied onto the first material layer 9. The second material layer 10 can be also a prepreg material layer. The prepreg material of the second material layer 10 can be the same as the prepreg material of the first material layer 9. In this case, an essential purpose of the second material layer 10 is the improvement of the flatness of the upper surface. However, it can also be the case that the material of the second material layer 10 is different from the material of the first material layer 9. The prepreg material can consist of or include an epoxy material highly filled with glass fibers or, in other words, a glass fiber sheet or mat which is filled or impregnated with epoxy material. However, the material of one or both of the first and second material layers 9 and 10 can also be another material than a prepreg material. It is also possible that in addition to the second material layer 10 a third or even more material layers, in one embodiment prepreg material layers, can be laminated on top of one another. After applying or laminating of the material layers the stack of material layers is hardened as is in principle known in the prior art.

Referring to FIG. 4E, after hardening of the material layers 9 and 10, through-holes 6 are formed into the substrate 1, the first material layer 9 and the second material layer 10. The through-holes 6 can be formed by any conventional technologies as known in the prior art like, for example, drilling, punching or laser ablation. The through-holes 6 are formed so that they extend through the contact elements 7 in order to electrically connect the contact elements 7 in a later process to contact pads on the outside of the package as will be illustrated further below.

Referring to FIG. 4F, the through-holes 6 have been filled with an electrically conductive material thereby forming electrical conductors 16 between the upper surface of the second material layer 10 and the lower surface of the substrate 1. In addition, first contact pads 1.1 are formed on the lower surface of the substrate 1, and second contact pads 10.1 are formed on the upper surface of the second material layer 10. Therefore, the contact elements 7 can be electrically connected to one of the first contact pads 1.1 or one of the second contact pads 10.1, respectively.

Referring to FIG. 4G, the whole panel is singulated or separated into a plurality of sensor chip packages 20 one of which is illustrated in FIG. 4G. According to this embodiment, the sensor chip package 20 contains one single sensor chip 2. However, it is also possible that the sensor chip package 20 contains one or more sensor chips or one sensor chip and one or semiconductor chips like, for example, (a "controller chip" erstes Band diktiert) an ASIC or any other integrated logic circuit as known in the art. The sensor chip package 20 as fabricated includes first electrical contact pads 1.1 on the lower surface of the substrate 1 and second electrical contact pads 10.1 on the upper surface of the second material layer 10. However, it can also be the case that electrical contact pads are only formed on one of the surface of the substrate 1 and the surface of the second material layer 10. The sensor chip package 20 can then be mounted onto, for example, a printed circuit board (PCB) by using the SMT technology (surface mounting technique).

Referring to FIGS. 5A-G, there are illustrated schematic representations of intermediate products and a device in a sectional side view, respectively, in order to illustrate fabrication processes of a further embodiment of a method for fabricating a device. It is to be noted that the only difference of the embodiment as depicted in FIGS. 5A-G with respect to the embodiment as depicted in FIGS. 4A-G lies in the way of attaching the sensor chip 2 to the substrate 1, in one embodiment the way of connecting the contact pads of the sensor chip 2 to the contact elements on the substrate 1.

Referring to FIG. 5A, an arrangement similar as that depicted in FIG. 4A is fabricated besides the fact that the through-hole 1A can be located at another position as will be explained further below.

Referring to FIG. 5B, a sensor chip 2 is provided having contact pads (not illustrated) on a main surface thereof. The sensor chip 2 is connected up-side-down onto the contact element 7 by a flip-chip technique. In this technique solder balls 18 are connected to the contact pads on the main surface of the sensor chip 2 and the sensor chip 2 is connected with the solder balls 18 to the contact elements 7 which have been fabricated on the surface of the substrate 1. If the sensor chip 2 is connected in this way to the substrate 1, the result is that a distance between the active main surface of the sensor chip 2 and the upper surface of the substrate 1 will be obtained. Therefore, the through-hole 1A can be located directly below the sensor chip 2 as the signal access can also be accomplished by accessing the space within the distance between the sensor chip 2 and the surface of the substrate 1.

Figure 5G:
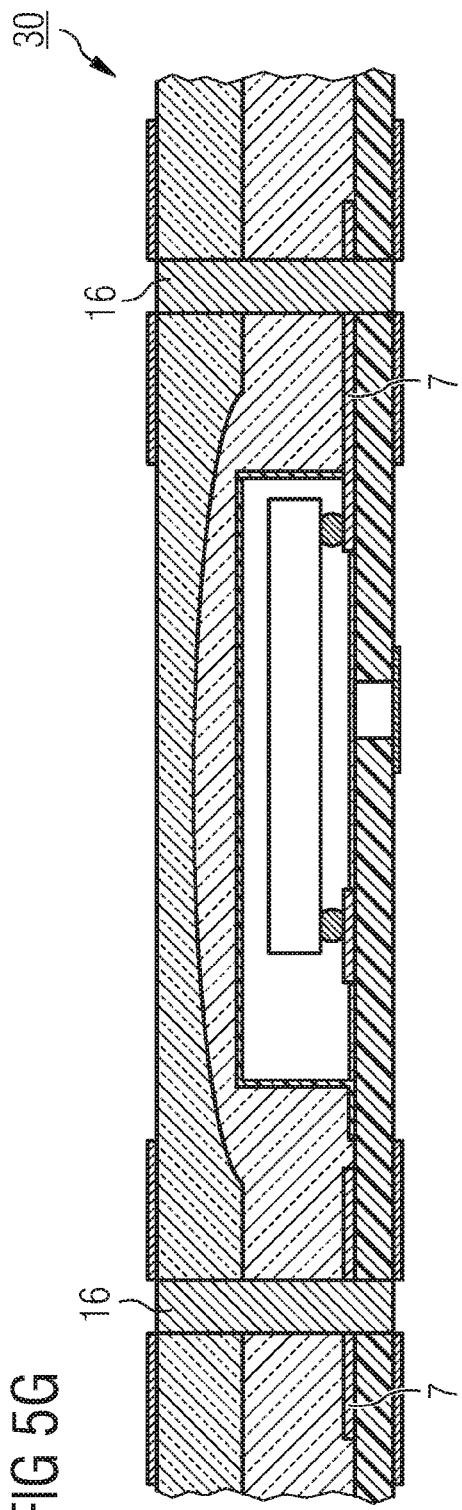

Referring to FIGS. 5C-G, the fabrication processes are similar to those as already depicted and explained with respect to FIGS. 4C-G above. The result of the fabrication process is a sensor chip package 30 as depicted in FIG. 5G.

Referring to FIG. 6A, the fabrication process is started with a substrate 21, which can be, for example, a standard multilayer substrate including an electrically insulating material having electrically conductive interlayers or interlayer sections. Into the substrate 21 a recess or cavity 24 is formed having a depth reaching to a interlayer plane in which electrically conductive regions 27 are present. On the upper surface of the substrate 21 further electrically conductive regions 23 are formed. A through-hole 28A is formed between a lower surface of the substrate 21 and a bottom surface of the cavity 24. The through-hole 21A serves the purpose of providing signal access to a sensor chip to be applied.

Referring to FIG. 6B, a sensor chip 22 is applied to the bottom surface of the cavity 24 in the same way as it was explained in connection with FIG. 4B. The contact pads (not illustrated) of the sensor chip 22 are connected to selected ones of the electrically conductive regions 27 by using wire bonds 28.

Referring to FIG. 6C, a cover plate 29 is laid on edge portions of the upper surface of the substrate 21 so as to hermetically seal the cavity 24. The cover plate 25 can be of any solid-state material like, for example, a metal, a plastic or a semiconductor material. If it is made of an electrically conductive material it may in addition serve as a shielding layer for shielding the sensor chip 22 against electrical and/or magnetic fields. For this purpose cover plate 29 is electrically connected to the electrically conductive regions 23.

Referring to FIGS. 6D-G, similar fabrication processes are carried out as was already explained above in connection with FIGS. 4D-G and FIGS. 5D-G. In one embodiment, a material layer 29 which can be made of a prepreg material is laminated onto the structure (FIG. 6D). Afterwards through-holes 26 are formed through the substrate 21 and the material layer 29 aligned with selected ones of the electrically conductive regions 27, respectively (FIG. 6E). Afterwards the through-holes 26 are filled with an electrically conductive material to form electrical conductors 36. In addition electrically conductive regions 29.1 are formed on the upper surface of the material layer 29 and electrically conductive regions 21.1 are formed on the lower surface of the substrate 21, wherein the electrically conductive regions 29.1 and 21.1 are connected to selected ones of the electrical conductors 36 and serve as outer electrical contact elements electrically connected via the electrically conductive regions 27 and the bond wires 28 to the contact pads of the sensor chip 2 (FIG. 6F). Finally the panel is singulated and separated into a plurality of sensor chip packages one of which is illustrated in FIG. 6G and designated with reference sign 40.

It is to be noted that the embodiment as illustrated above in FIGS. 6A-G can be varied in the same way as was explained in connection with FIGS. 5A-G, namely in that the sensor chip 2 can be mounted within the cavity 24 by using the flip-chip technique.

It is to be noted that in all the embodiments as depicted above in connection with FIGS. 4A-G, 5A-G, and 6A-G, the through-hole 1A or 21A which serves the purpose of signal access to the respective cavity, does not need to be formed in an early fabrication process, namely as was illustrated before attaching the sensor chip 2. In one embodiment, the through-hole can also be formed after the final process of singulating and separating the panel into a plurality of sensor chip packages. The through-hole can then be formed into the singulated sensor chip packages individually.

Referring to FIG. 7, there is illustrated a schematic representation of a further embodiment of a device in a sectional side view. The device 300 includes a first substrate 310, a first chip 320 disposed above the first substrate 310, the first chip 320 being a sensor chip, a second substrate 330 disposed in a spaced and opposite relationship to the first substrate 310, a second chip 340 disposed above the second substrate 330 and in a spaced and opposite relationship to the first chip 320, and a material layer 350 disposed between the first substrate 310 and the second substrate 330, a first cavity 360 formed between the first substrate 310 and the material layer 350, wherein the first chip 320 is disposed inside the first cavity 360, and a second cavity 370 formed between the second substrate 330 and the material layer 350, wherein the second chip 340 is disposed inside the second cavity 370.

According to an embodiment of the device 300, the second chip 340 can be a processing chip or a controlling chip like, for example, an ASIC chip, for controlling the first chip 320. In one embodiment, the second chip 340 can also be a sensor chip and it can, for example, be a sensor chip having the same function as the first chip 320.

According to a further embodiment, a first housing 380 is provided wherein the first cavity 360 is defined by the interior by the first housing 380, and a second housing 390 is provided wherein the second cavity 370 is defined by the interior of the second housing 390.

According to a further embodiment, the material layer 350 consists of or includes a prepreg material.

Referring to FIG. 8, there is illustrated a flow diagram of an embodiment of a method for fabricating a device like, for example, the device as illustrated in FIG. 7. The method includes applying a first chip above a first substrate, the first chip being a sensor chip (s1), applying a second chip above a second substrate (s2), arranging the second substrate in a spaced and opposite relationship to the first substrate so that the first chip is in a spaced and opposite relationship to the second chip (s3), and applying a material layer between the first substrate and the second substrate so that a first cavity is formed between the first substrate and the material layer, the first chip being disposed inside the first cavity, and a second cavity is formed between the second substrate and the material layer, the second chip being disposed inside the second cavity (s4).

According to one embodiment, a first housing is applied to the first substrate, wherein the first cavity is defined by the interior of the first housing.

According to a further embodiment, a second housing is applied to the second substrate, wherein the second cavity is defined by the interior of the second housing.

According to a further embodiment, the material layer consists of or including a prepreg material.

Referring to FIGS. 9A-E, there are illustrated schematic representations of intermediate products and a device in a sectional side view, respectively, for illustrating the fabrication processes according to a further embodiment to fabricate a device.

Referring to FIGS. 9A-C, the same fabrication processes are illustrated as in the above FIGS. 5A-C. However, it is to be noted that the fabrication process as of FIGS. 9A-C is performed with a first substrate 1 onto which a first chip 2 is mounted, and with a second substrate 101 onto which a second chip 102 is to be mounted. Whereas the first chip 2 is a sensor chip, the second chip 102 can be a sensor chip but can also be another semiconductor chip like, for example, a processor chip or a controller chip like an ASIC chip.

Both substrates 1 and 101 can be large area substrates having typically the size of a semiconductor wafer or even bigger than that so that on each of the substrates 1 and 101 a respective plurality of chips 2 and 102 can be placed.

Referring to FIG. 9D, an intermediate product is illustrated obtained after laminating material layers onto the first and second substrates, respectively, and providing a further material layer for connecting the two panels together. A first material layer 9 is applied to the first substrate 1 and the housing 5 attached thereto and a second material layer 109 is applied to the second substrate 101 and the housing 105 attached thereto. Then a third material layer 110 is applied to one of the first material layer 9 or the second material layer 109 and afterwards the structure as illustrated in FIG. 9D is produced by attaching the substrates 1 and 101 together with the third material layer 110 in-between. The second material layer 109 and the third material layer 110 can be made of the same material as the first material layer 9 and can have the same properties and also the same method processes can be applied with the second material layer 109 and the third material layer 110 as was explained in connection with FIG. 5D with respect to the first material layer.

Referring to FIG. 9E, at least one through-hole is formed through the first substrate 1, the second substrate 101, the first material layer 9, the second material layer 109, and the third material layer 110 at a position so that the through-hole reaches through electrically conductive regions connected with the respective chips. Then the through-hole is filled with an electrically conductive material to form an electrical conductor 116 and contact pads 117 are formed on the surface of the first substrate 1 and/or the surface of the second substrate 101, the electrically conductive contact pads 117 being connected with the electrical conductors 116.

It is to be noted that the arrangement as depicted in FIGS. 9D-E is not necessarily symmetrical with respect to the opposing housings 5 and 105 and their dimensions, the electrically conductive regions, the thickness and material of the first and second substrates 1 and 101, respectively, the thickness and material of the first and second material layers 9, 109, respectively. These and other parameters can be chosen differently.

It should further be noted that the way of attaching and contacting the chips 2 and 102 to their respective substrates and electrical contact areas can also be performed according to the embodiment of FIGS. 4A-G, namely by adhering one surface of the chip to the substrate an electrical connecting via wire bonds.

Referring to FIG. 10, there is illustrated a schematic representation of a further embodiment of a device in a sectional side view. The device 400 as illustrated in FIG. 10 includes a first substrate 401 and a second substrate 411. A first housing 405 is attached to the first substrate 401 and a second housing 415 is attached to the second substrate 411. Within the first housing 405 a first chip 402 is attached to a surface of the first substrate 401. The first chip 402 is in fact a double chip arrangement wherein one chip is attached with one of its surfaces to the surface of another chip. One of the chips is a sensor chip. Both chips include contact pads (not illustrated) connected by wire bonds to electrically conductive areas arranged on the surface of the first substrate 401. Within the second housing 415 a second chip 412 is attached to a surface of the second substrate 411. The second chip 412 includes contact pads (not illustrated) connected by wire bond to electrically conductive areas arranged on the surface of the second substrate 411. A first through-hole 401A is formed into the first substrate 401 for the purpose of signal access to the first chip 402. A second through-hole 411A is formed in the second substrate 411 and layers applied to the second substrate 411 for the purpose of signal access to the second chip 412. The second chip 412 can be as well a sensor chip as the first chip 402. A first material layer 406 is laminated onto the first substrate 401 and the first housing 405 and a second material layer 407 is laminated onto the second substrate 401 and the second housing 415. A third material layer 408 is laminated between the first material layer 406 and the second material layer 407 thereby mechanically connecting the first and second substrates 401 and 411 and the respective assemblies attached to them. A third chip 422 is attached to an upper surface of the second substrate 411. A fourth material layer 413 and a fifth material layer 414 are laminated onto the surface of the second substrate 411 and the third chip 422 so that the fifth material layer forms a virtually planar surface. Then through-holes are formed through the whole stack of substrates and material layers and filled with an electrically conductive material, respectively, to form electrical conductors 426. On the surfaces of the first substrate 401 and the fifth material layer 414 electrically conductive areas 427 are formed which are at least in part in connection with the electrical conductors 426. Electrically conductive bumps 428 are applied onto the electrically conductive areas 427 on the surface of the first substrate 401.

In addition, while a particular feature or aspect of an embodiment may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variance thereof are used in either the detailed description or the claims, such terms are intended to be inclusive in a manner similar to the term "comprise". The terms "coupled" and "connected" along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimension may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
   a first substrate;
   a first chip disposed above the first substrate, the first chip being a sensor chip;
   a second substrate disposed in a spaced and opposite relationship to the first substrate;

a second chip disposed above the second substrate and in a spaced and opposite relationship to the first chip;

a material layer disposed between the first substrate and the second substrate;

a first cavity formed between the first substrate and the material layer, wherein the first chip is disposed inside the first cavity; and a second cavity formed between the second substrate and the material layer, wherein the second chip is disposed inside the second cavity.

2. The device of claim 1, further comprising:

a first housing disposed above the first substrate, wherein the first cavity is defined by the inside of the first housing.

3. The device of claim 1, further comprising:

a second housing disposed above the second substrate, wherein the second cavity is defined by the inside of the second housing.

4. The device of claim 1, further comprising:

at least one electrical conductor formed through the first substrate, the second substrate and the material layer.

5. The device of claim 1, wherein the second chip is a controller chip to control the function of the first chip.

6. A method comprising:

applying a first chip above a first substrate, the first chip being a sensor chip;

applying a second chip above a second substrate arranging the second substrate in a spaced and opposite relationship to the first substrate so that the first chip is in a spaced and opposite relationship to the second chip; and applying a material layer between the first substrate and the second substrate so that a first cavity is formed between the first substrate and the material layer, the first chip being disposed inside the first cavity, and a second cavity is formed between the second substrate and the material layer, the second chip being disposed inside the second cavity.

7. The method of claim 6, further comprising:

applying a first housing to the first substrate, wherein the first cavity is defined by the inside of the first housing.

8. The method of claim 6, further comprising:

applying a second housing to the second substrate, wherein the second cavity is defined by the inside of the second housing.

9. The method of claim 6, comprising forming at least one electrical conductor through the first substrate, the second substrate and the material layer.

10. The method of claim 6, comprising applying the material layer by laminating it to the first substrate and the second substrate.

* * * * *